United States Patent
Chin et al.

(10) Patent No.: US 11,742,054 B2
(45) Date of Patent: Aug. 29, 2023

(54) MEMORY POWER FAULT RESILIENCE IN INFORMATION HANDLING SYSTEMS

(71) Applicant: Dell Products L.P., Round Rock, TX (US)

(72) Inventors: Jordan Chin, Austin, TX (US); Timothy M. Lambert, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 148 days.

(21) Appl. No.: 17/096,720

(22) Filed: Nov. 12, 2020

(65) Prior Publication Data

US 2022/0148675 A1 May 12, 2022

(51) Int. Cl.
| | |
|---|---|
| *G06F 11/00* | (2006.01) |
| *G11C 29/52* | (2006.01) |
| *G06F 11/22* | (2006.01) |
| *G06F 1/30* | (2006.01) |
| *G06F 9/54* | (2006.01) |
| *G06F 1/24* | (2006.01) |
| *G06F 9/4401* | (2018.01) |
| *G06F 1/28* | (2006.01) |

(52) U.S. Cl.
CPC ............ *G11C 29/52* (2013.01); *G06F 1/24* (2013.01); *G06F 1/28* (2013.01); *G06F 1/30* (2013.01); *G06F 9/4401* (2013.01); *G06F 9/542* (2013.01); *G06F 11/2284* (2013.01)

(58) Field of Classification Search
CPC .................. G06F 11/2284; G06F 11/0751
USPC ....................................... 714/1–57
See application file for complete search history.

(56) References Cited

U.S. PATENT DOCUMENTS

| | | | | |
|---|---|---|---|---|
| 6,904,541 B1* | 6/2005 | MacArthur | ......... | G06F 11/2015 714/22 |
| 7,117,323 B1* | 10/2006 | Delaney | .............. | G06F 11/1004 714/758 |
| 7,386,664 B1* | 6/2008 | Roy | ..................... | G06F 11/2082 714/6.23 |
| 7,954,006 B1* | 5/2011 | Mangipudi | ............... | G06F 1/30 713/340 |
| 2002/0002651 A1* | 1/2002 | MacLaren | ........... | G06F 13/4081 711/115 |
| 2003/0046529 A1* | 3/2003 | Loison | ................... | H04L 69/329 713/2 |
| 2003/0126494 A1* | 7/2003 | Strasser | .............. | G06F 11/1666 714/E11.138 |
| 2004/0153723 A1* | 8/2004 | Depew | ................. | G06F 11/1666 714/6.11 |
| 2010/0202238 A1* | 8/2010 | Moshayedi | .......... | G06F 11/1666 714/E11.12 |
| 2011/0066881 A1* | 3/2011 | Pierce | .................. | G06F 11/2284 714/E11.085 |

(Continued)

*Primary Examiner* — Sarai E Butler
(74) *Attorney, Agent, or Firm* — NORTON ROSE FULBRIGHT US LLP; Darren T. Smith

(57) ABSTRACT

A controller of an information handling system may detect a power fault event for one or more of a plurality of memories configured to operate in a memory mirroring mode. The controller may deactivate the one or more of the plurality of memories by mapping the one or more of the plurality of memories out from usage without rebooting the information handling system based, at least in part, on the detection of the power fault event and the received notification.

20 Claims, 6 Drawing Sheets

(56) References Cited

U.S. PATENT DOCUMENTS

| | | | |
|---|---|---|---|
| 2016/0253268 A1* | 9/2016 | Danilak | G06F 12/0246 |
| | | | 714/6.3 |
| 2016/0378623 A1* | 12/2016 | Kumar | G06F 3/0647 |
| | | | 714/3 |
| 2017/0060668 A1* | 3/2017 | Farhan | G06F 12/0871 |
| 2018/0246817 A1* | 8/2018 | Feehrer | G06F 3/0631 |
| 2020/0226045 A1* | 7/2020 | Le | G06F 1/30 |
| 2021/0124409 A1* | 4/2021 | Karthikeyan | G06F 1/3246 |

\* cited by examiner

MEMORY POWER FAULT RESILIENCE IN INFORMATION HANDLING SYSTEMS

FIELD OF THE DISCLOSURE

The present disclosure generally relates to information handling systems, and more particularly relates to memory power fault resilience in information handling systems.

BACKGROUND

As the value and use of information continue to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

Memory units, such as dual in-line memory modules (DIMMs), may be included in information handling systems for data storage. As information handling systems increase in complexity, greater numbers of memory units are incorporated in information handling systems. A number of standards for design and operation of DIMMs exist, such as double data rate 4 (DDR4) and double data rate 5 (DDR5). Some information handling systems, such as servers, may include up to or exceeding sixty-four DIMM slots. In some cases, DIMM slots may include up to or exceeding four sockets, each socket housing a DIMM.

DIMMs may be powered by one or more voltage rails. For example, a single voltage rail may power multiple DIMMs or each DIMM may be powered by an individual voltage rail. Some information handling systems, such as 4S information handling systems, may include up to or exceeding 256 regulated voltage rails for powering DIMMs. For example, an information handling system may include 64 4-socket DIMM slots, with each DIMM slot having three to four voltage rails. In some embodiments, information handling systems may further include additional voltage rails for delivering power to the CPU, to backplanes, OPC network interface cards, and other information handling system components. Such voltage rails may be monitored using baseboard logic.

Power management integrated circuits (PMICs) may be used to manage and/or monitor power delivered to DIMMs via voltage rails. PMICs may, for example, include voltage regulators (VRs) for controlling a voltage supplied to one or more DIMMs. In some cases, a single PMIC may control power delivered to multiple DIMMs, such as power delivered to multiple DIMMs via a single voltage rail, while in other cases PMICs may be included for each DIMM for controlling power delivered to each DIMM, such as via a voltage rail specific to each DIMM. When a power fault of a DIMM is detected, such as a voltage on a voltage rail for the DIMM exceeding or falling below a predefined threshold, a controller of the information handling system may power down the information handling system to prevent damage to the information handling system that may result from the power failure. Such shutdowns may be undesirable, often requiring intervention by a trained technician prior to rebooting the information handling system and increasing system downtime. Such shutdowns can increase a cost of maintaining information handling systems and negatively impact information handling system uptime.

Shortcomings mentioned here are only representative and are included simply to highlight that a need exists for improved information handling systems. Embodiments described herein address certain shortcomings but not necessarily each and every one described here or known in the art. Furthermore, embodiments described herein may present other benefits than, and be used in other applications than, those of the shortcomings described above.

SUMMARY

A controller of an information handling system, such as a complex programmable logic device (CPLD), may monitor one or more memories of the information handling system for power faults. When a power fault in a memory of the information handling system is detected, the controller may intervene to prevent the power fault from triggering an automatic shutdown or reboot of the information handling system, if the memory is configured in a memory mirroring mode such that another memory of the information handling system that has not encountered a power fault is mirroring the contents of the memory that encountered the power fault. The information handling system may continue operation, using the mirrored memory that did not experience the power fault, while avoiding costly system downtime. Furthermore, when an information handling system reboots, a controller of the information handling system may be configured to refrain from arming a power fault detection procedure until a power good (PG) signal is detected for one or more memories. In some embodiments, the controller may be informed of memories that have experienced power faults, such as startup or runtime power faults, and thus are deactivated. The controller may refrain from arming a power fault detection procedure for the deactivated memories to prevent triggering of information handling shutdowns caused by transient power variations in deactivated memories. Furthermore, memories that have experienced power faults may be monitored and reactivated on a provisional basis when one or more monitoring thresholds are met. This can allow an information handling system to recover from runtime memory power faults without intervention by a trained technician.

An example method for handling power faults in an information handling system may begin with receiving a notification that each of a plurality of memories controlled by a controller is configured in a memory mirroring mode. For example, a controller of an information handling system may be notified by a basic input output system (BIOS) of the information handling system that two or more memories are configured to operate in a memory mirroring mode, with one or more memories of the information handling system storing at least some information identical to information stored on other memories of the information handling system. Each of the plurality of memories may, for example, include one or more dual in-line memory modules (DIMMs). Each DIMM may include an individual PMIC providing power control for the DIMM. In some embodiments, the notification that each of a plurality of memories controlled by the controller is configured in a memory mirroring mode may be received by the controller from a BIOS of the information handling system during a power-on self-test (POST) boot phase, while the information handling system is booting.

During operation of an information handling system, such as at runtime, memories of an information handling system may encounter power faults. For example, a PMIC controlling a voltage rail for delivering power to a memory of the information handling system may fail, or may detect a power failure of a DIMM, exposing the memory to voltage and/or current outside of a predetermined range. A controller of the information handling system, such as a CPLD, may detect a power fault event in one or more of the plurality of memories configured in the memory mirroring mode. For example, the controller may detect that one or more power good (PG) signals for one or more of the memories has exceeded or fallen below a predetermined range. PG signals may be generated by each DIMM PMIC of the information handling system and may be monitored by the controller to detect DIMM power faults. In some embodiments, a single PG signal may be generated by multiple PMICs of multiple DIMMs that are grouped together in a power group. The PG signal may, for example, be high if a power fault has not occurred and may drop to a low level if a power fault has been detected by the PMIC generating the PG signal.

The memories for which the power fault was detected may be deactivated, and the information handling system may operate using the mirrored memories in place of the deactivated memories without rebooting. For example, the controller of the information handling system may deactivate the one or more of the plurality of memories that encountered the power fault event by mapping the one or more of the plurality of memories out from usage by the information handling system based, at least in part, on the detection of the power fault event and the received notification that each of the plurality of memories is configured in a memory mirroring mode. The information handling system may then continue operation without rebooting in response to the power fault. Avoiding an information handling system shutdown in response to a memory power fault event may allow the information handling system to continue operation using one or more memories mirroring the contents of the one or more memories for which the power fault event was detected.

During booting of an information handling system, the information handling system may wait until a power good (PG) signal is detected for one or more memories of the information handling system to initialize monitoring for runtime power fault events for the memories. Initializing monitoring for runtime power fault events for the memories may include arming a runtime power fault detection mechanism for the memories. A controller of the information handling system may detect a rising edge of a power good (PG) signal for at least one of the plurality of memories of the information handling system during the POST boot phase. For example, the controller may monitor for and detect rising edges of multiple PG signals for multiple memories of the information handling system.

Based on the detection of the rising edge(s) of the PG signal(s), the controller of the information handling system may arm a runtime power fault detection mechanism for detecting runtime power faults associated with one or more memories of the information handling system. For example, the controller may arm a runtime power fault detection mechanism for each of one or more memories associated with the detected PG signal and may refrain from arming a runtime power fault detection mechanism for memories for which a PG signal is not detected.

In some embodiments, memories that have encountered a power fault, such as a runtime power fault, and have been deactivated may maintain a PG signal during a reboot to prevent a controller of the information handling system from detecting a power fault during the booting process and shutting down the information handling system. In some embodiments, a BIOS of the information handling system may notify a controller of one or more memories of the information handling system of memories that have been deactivated. For example, the BIOS may configure one or more PMICs of the deactivated memories to set PG pins of the PMIC(s) as input only. Thus, the deactivated memories may avoid triggering runtime fault detection by the CPLD as the PG pins of the PMIC(s) may be configured only to receive input from the controller and not to notify the controller of runtime power faults. The controller may arm a runtime power fault detection mechanism only for memories that are not indicated by the message as deactivated and may refrain from arming the runtime power fault detection mechanism for memories that have been deactivated. Thus, the information handling system may reduce false flag detection of power fault events in memories that have been de-energized, such as detection of power faults due to transients or noise in PG signals for the one or more de-energized memories.

In some embodiments, an information handling system may initialize a monitoring policy for one or more memories for which a power fault was detected. For example, when a power fault event occurs, a controller may begin monitoring a PG signal for the one or more memories associated with the power fault event, to determine whether the power fault event was merely a temporary error or a long term failure.

The controller may detect that a PG signal, for the one or more memories of the information handling system for which the power fault event was detected, has met a predetermined threshold for a predetermined period of time. For example, the controller may determine that the detected power fault event was a temporary failure and not a long term failure by monitoring a PG signal for the one or more memories for which the power fault event was detected.

The controller may reactivate the one or more memories for which the power fault event was detected based, at least in part, on the detected PG signal. For example, the controller may instruct a BIOS of the information handling system, upon a reboot, to map the one or more memories for which the power fault event was detected into an available memory space of the information handling system. In some embodiments, the controller may instruct the BIOS to implement a memory mirroring mode for the one or more memories for which the power fault event was detected such that one or more memories that have not encountered a power fault event are mirroring the contents of the one or more memories that encountered the power fault event. After a predetermined period of time has passed and the one or more memories have not encountered a power fault event, the information handling system may deactivate the memory mirroring mode to make the memory used to mirror the contents of the one or more memories that encountered the power fault event available for other applications. In some embodiments, the one or more memories may be reactivated following a reboot of the information handling system. In some embodiments, the memories may be reactivated via a hot-add method, without a reboot of the information handling system. Thus, a memory that has encountered a power fault event can be provisionally reinstated without requiring intervention by a trained technician, if a determination is made that the power fault event was a temporary power fault event.

An information handling system may include a memory and a controller for performing the steps described herein. Alternatively or additionally, a computer program product may include a non-transitory computer-readable medium comprising instructions to cause a controller to perform the steps described herein.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

DETAILED DESCRIPTION OF DRAWINGS

The following description in combination with the FIGURES is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be used in this application. The teachings can also be used in other applications and with several different types of architectures.

For purposes of this disclosure, an information handling system (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, a two-in-one laptop/tablet computer, mobile device (e.g., personal digital assistant (PDA), smart phone, tablet computer, or smart watch), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more virtual or physical buses operable to transmit communications between the various hardware and/or software components.

Figure 1:
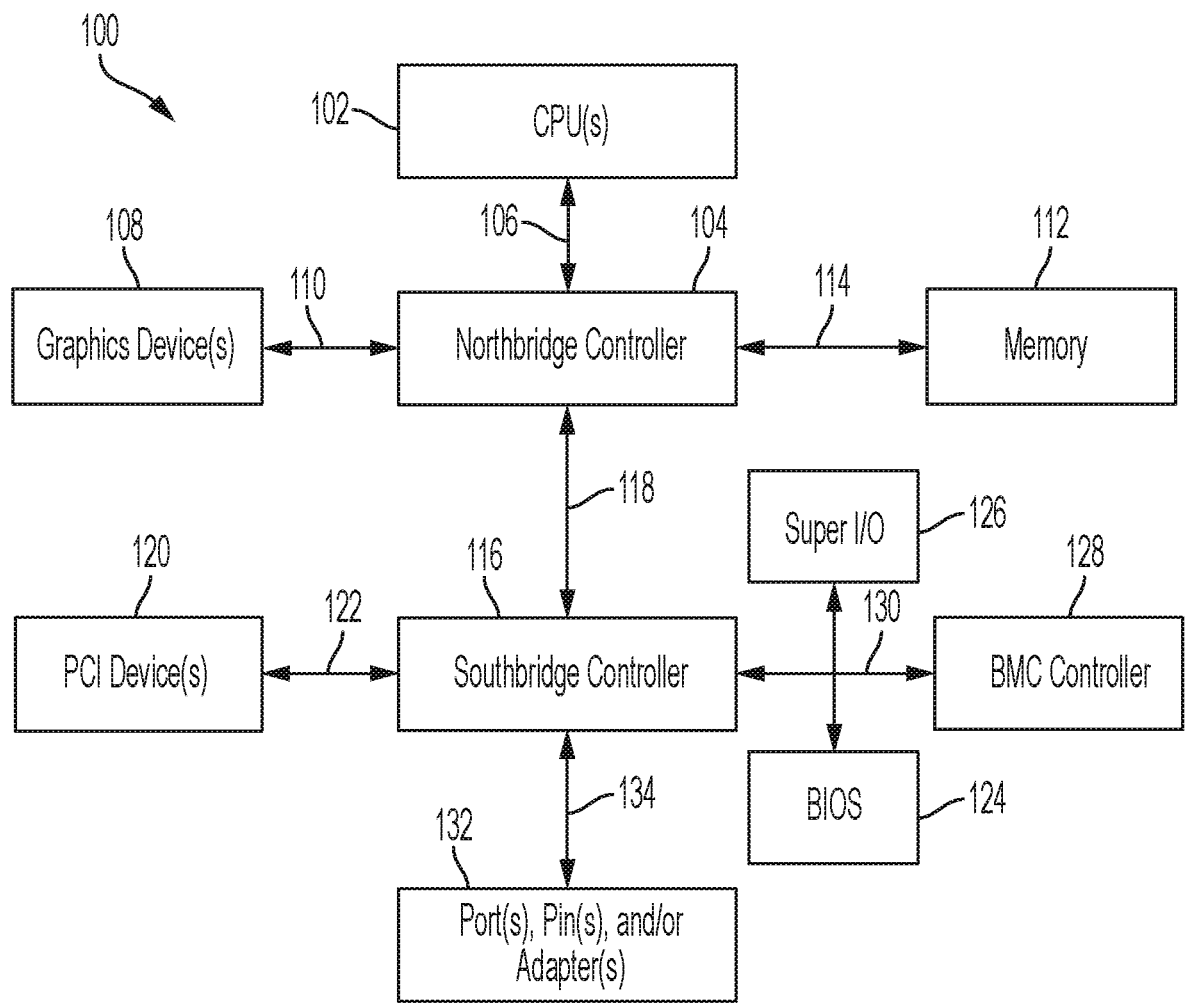
FIG. 1 is a block diagram of an example information handling system, according to some embodiments of the disclosure.

An information handling system may include a variety of components to generate, process, display, manipulate, transmit, and receive information. One example of an information handling system 100 is shown in FIG. 1. IHS 100 may include one or more central processing units (CPUs) 102. In some embodiments, IHS 100 may be a single-processor system with a single CPU 102, while in other embodiments IHS 100 may be a multi-processor system including two or more CPUs 102 (e.g., two, four, eight, or any other suitable number). CPU(s) 102 may include any processor capable of executing program instructions. For example, CPU(s) 102 may be processors capable of implementing any of a variety of instruction set architectures (ISAs), such as the x86, POWERPC®, ARM®, SPARC®, or MIPS® ISAs, or any other suitable ISA. In multi-processor systems, each of CPU(s) 102 may commonly, but not necessarily, implement the same ISA.

CPU(s) 102 may be coupled to northbridge controller or chipset 104 via front-side bus 106. The front-side bus 106 may include multiple data links arranged in a set or bus configuration. Northbridge controller 104 may be configured to coordinate I/O traffic between CPU(s) 102 and other components. For example, northbridge controller 104 may be coupled to graphics device(s) 108 (e.g., one or more video cards or adaptors, etc.) via graphics bus 110 (e.g., an Accelerated Graphics Port or AGP bus, a Peripheral Component Interconnect or PCI bus, etc.). Northbridge controller 104 may also be coupled to memory 112 via memory bus 114. Memory 112 may be configured to store program instructions and/or data accessible by CPU(s) 102. In various embodiments, memory 112 may be implemented using any suitable memory technology, such as static RAM (SRAM), synchronous dynamic RAM (SDRAM), nonvolatile/Flash-type memory, or any other type of memory.

Northbridge controller 104 may be coupled to southbridge controller or chipset 116 via internal bus 118. Generally, southbridge controller 116 may be configured to handle various of IHS 100's I/O operations, and it may provide interfaces such as, for instance, Universal Serial Bus (USB), audio, serial, parallel, Ethernet, etc., via port(s), pin(s), and/or adapter(s) 132 over bus 134. For example, southbridge controller 116 may be configured to allow data to be exchanged between IHS 100 and other devices, such as other IHSs attached to a network. In various embodiments, southbridge controller 116 may support communication via wired or wireless general data networks, such as any suitable type of Ethernet network, for example; via telecommunications/telephony networks such as analog voice networks or digital fiber communications networks; via storage area networks such as Fiber Channel SANs; or via any other suitable type of network and/or protocol.

Southbridge controller 116 may also enable connection to one or more keyboards, keypads, touch screens, scanning devices, voice or optical recognition devices, or any other devices suitable for entering or retrieving data. Multiple I/O devices may be present in IHS 100. In some embodiments, I/O devices may be separate from IHS 100 and may interact with IHS 100 through a wired or wireless connection. As shown, southbridge controller 116 may be further coupled to one or more PCI devices 120 (e.g., modems, network cards, sound cards, video cards, etc.) via PCI bus 122. Southbridge controller 116 may also be coupled to Basic I/O System (BIOS) 124, Super I/O Controller 126, and Baseboard Management Controller (BMC) 128 via Low Pin Count (LPC) bus 130.

BIOS 124 may include non-volatile memory having program instructions stored thereon. The instructions stored on the BIOS may be usable CPU(s) 102 to initialize and test other hardware components and/or to load an Operating System (OS) onto IHS 100, for example during a pre-boot stage. As such, BIOS 124 may include a firmware interface that allows CPU(s) 102 to load and execute certain firmware, as described in more detail below. In some cases, such firmware may include program code that is compatible with the Unified Extensible Firmware Interface (UEFI) specification, although other types of firmware may be used. The BIOS 124 may control a configuration of one or more PMICs of one or more memories of the information handling system, such as memory 112. For example, the BIOS 124 may control a memory mirroring configuration of the memories and/or an activation status of one or more PMICs of the one or more memories.

BMC controller 128 may include non-volatile memory having program instructions stored thereon that are usable by CPU(s) 102 to enable remote management of IHS 100. For example, BMC controller 128 may enable a user to discover, configure, and manage BMC controller 128, setup configuration options, resolve and administer hardware or software problems, etc. Additionally or alternatively, BMC controller 128 may include one or more firmware volumes, each volume having one or more firmware files used by the BIOS' firmware interface to initialize and test components of IHS 100.

Super I/O Controller 126 combines interfaces for a variety of lower bandwidth or low data rate devices. Those devices may include, for example, floppy disks, parallel ports, keyboard and mouse, temperature sensor and fan speed monitoring, etc. For example, the super I/O controller 126 may be coupled to the one or more upstream sensors 106 and to the one or more downstream sensors 108.

In some embodiments, IHS 100 may be configured to access different types of computer-accessible media separate from memory 112. Generally speaking, a computer-accessible medium may include any tangible, non-transitory storage media or memory media such as electronic, magnetic, or optical media—e.g., magnetic disk, a hard drive, a CD/DVD-ROM, a Flash memory, etc. coupled to IHS 100 via northbridge controller 104 and/or southbridge controller 116.

In some embodiments, northbridge controller 104 may be combined with southbridge controller 116, and/or be at least partially incorporated into CPU(s) 102. In other implementations, one or more of the devices or components shown in FIG. 1 may be absent, or one or more other components may be added. Accordingly, systems and methods described herein may be implemented or executed with other computer system configurations. In some cases, various elements shown in FIG. 1 may be mounted on a motherboard and protected by a chassis or the like.

Figure 2:
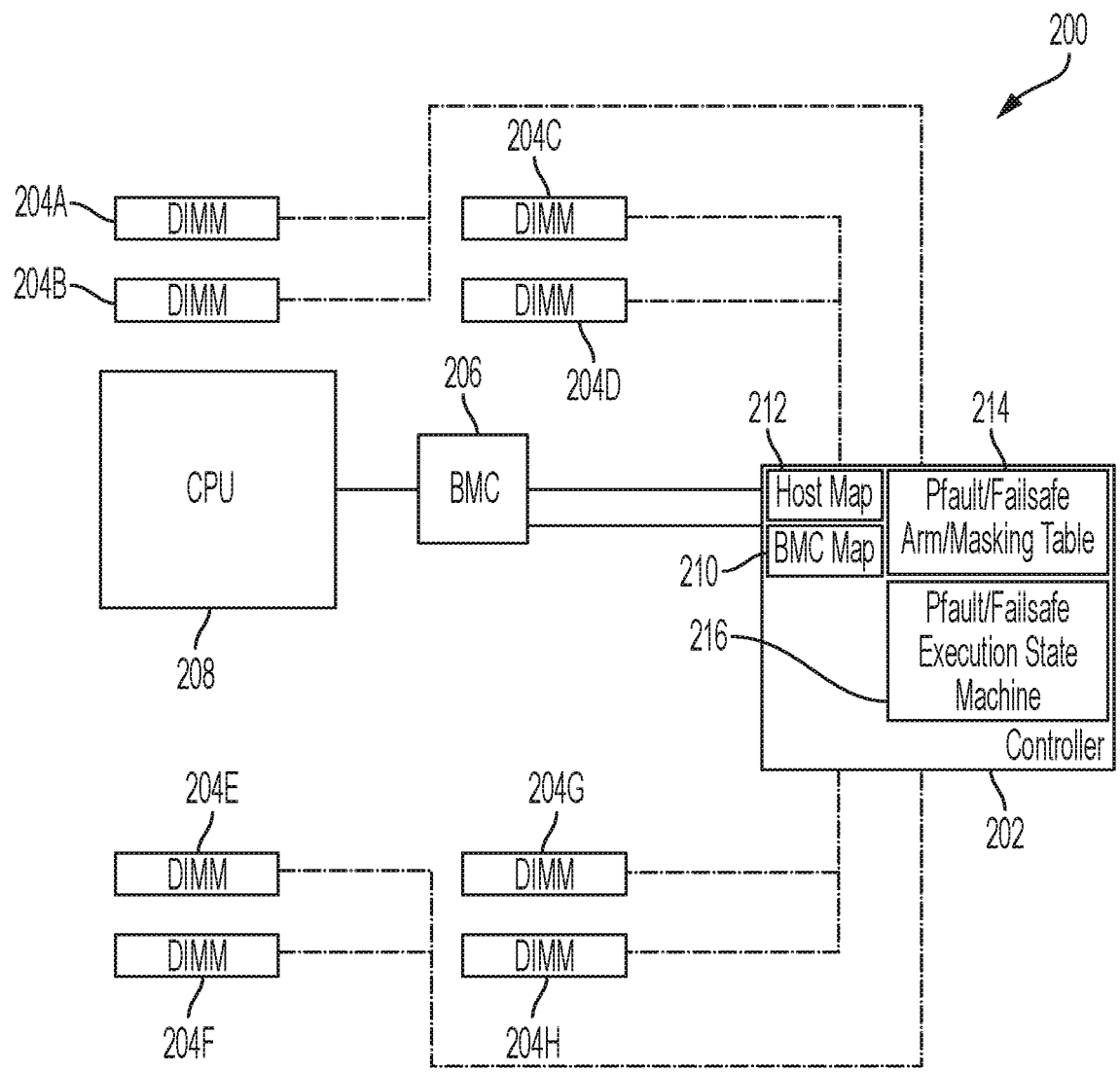
FIG. 2 is a block diagram of an example controller monitoring a plurality of DIMM groups according to some embodiments of the disclosure.

An information handling system may include multiple memories for storing data being handled by the information handling system. For example, the memories may include multiple DIMMs for storing data. The DIMMs may be designed according to and may operate according to one or more of a number of standards for information handling system memory operation. For example, the DIMMs may operate according to DDR4, first generation DDR5, and/or second generation DDR5. In some embodiments, multiple DIMMs may be grouped together, monitored, and controlled, in a single power group. A plurality of DIMMs 204A-H monitored and controlled by a controller 202, such as a complex programmable logic device (CPLD), of an information handling system 200 are shown in FIG. 2. The controller 202 may control operation of the DIMMs 204A-H, such as activation of the DIMMs 204A-H and power delivery to the DIMMs 204A-H. The connections between the controller 202 and the DIMMs 204A-H may, for example, include PG signal monitoring connections for monitoring PG signals for the DIMMs 204A-H. The DIMMs 204A-H may be grouped together in power groups. For example, each of DIMMs 204A-H may include a PMIC for controlling power delivery, and multiple PMICs in a power group may communicate with each other to determine a single power good (PG) status for the power group. PMICs of each power group may be connected to controller 202 via a single bus, such as a single PG bus, and thus a single PG signal may be monitored by the controller 202 for each power group. For example, DIMMs 204A-B may form a first power group, and PMICs of each of DIMMs 204A-B may control power delivery to each of DIMMs 204A-B via one or more voltage rails. PMICs of each of DIMMs 204A-B may communicate with each other to establish a single PG status for the first power group. DIMMs 204C-D may form a second power group, and PMICs of each of DIMMs 204C-D may control power delivery to DIMMs 204C-D via one or more voltage rails. PMICs of each of DIMMs 204C-D may communicate with each other to establish a single PG status for the second power group. DIMMs 204E-F may form a third power group, and PMICs of each of DIMMs 204E-F may control power delivery to DIMMs 204E-F via one or more voltage rails. PMICs of each of DIMMs 204E-F may communicate with each other to establish a single PG status for the third power group. DIMMs 204G-H may form a fourth power group, and PMICs of each of DIMMs 204G-H may control power delivery to DIMMs 204G-H via one or more voltage rails. PMICs of each of DIMMs 204G-H may communicate with each other to establish a single PG status for the fourth power group. In some embodiments, PMICs for DIMMs may be external to the DIMMs themselves. Thus, the controller 202 may control and/or monitor the PMICs for each of the power groups of DIMMs and may monitor for power faults in the DIMMs and/or power groups by monitoring a PG status for each of the DIMM power groups.

DIMMs may encounter power faults, such as voltages and/or currents outside of a set tolerance range and/or failure of one or more PMICs controlling power delivery to the DIMMs. The controller 202 may monitor the DIMMs 204A-H for power faults. For example, the controller 202 may execute a power fault/failsafe state machine 216 to monitor for and handle any power faults in the DIMMs 204A-H that are detected. Using the power fault/failsafe state machine 216, the controller 202 may deactivate one or more DIMMs 204A-H when a power fault event associated with one or more DIMMs is detected. The controller 202 may monitor for power fault events by monitoring power good (PG) signals for the DIMMs 204A-H. PG signals for the DIMMs 204A-H may be generated by each PMIC for the DIMMs. In some embodiments, a single PG signal may be generated for multiple DIMMs of a power group by PMICs of each of the DIMMs. A PG signal may, for example, be a signal indicating that a voltage, current, and/or power supplied to a memory of an information handling system is within a predetermined range. If one of the DIMMs in a power group encounters a power fault event, it may deactivate and drive a shared PG signal for the power group, monitored by the controller 202, low. The other DIMM(s) in the power group may detect that the PG signal for the power group has been driven low and may deactivate. Thus, the controller 202 may monitor PG signals for each power group to determine whether any of the power groups have encountered power fault events. When a PG signal falls below a predetermined level, the controller 202 may detect that the DIMMs associated with the PG signal have encountered a power fault event. For example, a power fault event may occur when a voltage regulator for a DIMM, such as a voltage regulator of a DIMM PMIC, fails. While some information handling systems may respond to detected power fault events by shutting down the information handling system 200 entirely, such shutdowns are undesirable and can cause costly system downtime.

The controller 202 may communicate with the baseboard management controller (BMC) 206 via a serial peripheral interface (SPIx) and/or a high-speed synchronous serial interface (HSIOX). The BMC 206 may communicate with the CPU 208 via an enhanced serial peripheral interface (eSPI). An inter-integrated circuit interface (I2C) and/or an I3C interface may be multiplexed between the CPU 208 and the BMC 206 during and following a POST boot phase. The CPU 208 may execute a BIOS, a memory reference code (MRC) of the BIOS, and/or a platform security processor code of the BIOS.

The controller 202 may include a host map 212 specifying which DIMMs are activated and which DIMMs are deactivated. For example, a BIOS of the information handling system may write the information of the host map 212 to the controller 202. The host map 212 may also contain information regarding which DIMMs are configured to operate in a memory mirroring mode. The controller 202 may further include a BMC map 210. The BMC map 210 may include the information of the host map 212 and may be used by a BMC in reporting a status of DIMMs of the information handling system to a user. The controller 202 may monitor a PG status of one or more DIMMs or one or more power groups of DIMMs and may report the monitored status to the BMC and other information handling system components.

Two or more of the DIMMs 204A-H may be configured to operate in a memory mirroring mode. For example, a copy of at least some of the contents of memory 204A may be stored on memory 204H. The controller 202 may receive, from a BIOS of the information handling system 200 executed by the CPU 208, a notification of which memories are configured in a memory mirroring mode and which memories are configured to mirror contents of other memories. The controller 202 may store the information included in the notification in memory, such as in a power fault/failsafe arm/masking table. In some embodiments, the BIOS may configure one or more DIMMs of the information handling system to operate in a memory mirroring mode. The BIOS may notify the controller 202 of the DIMMs, such as a CPLD, of the memory mirroring mode configuration via a system management interrupt and/or via providing information of a host map 212 to the controller 202. When a power fault event is detected, the controller 202 may compare the identity of the DIMM for which the power fault event was detected with an identity of DIMMs configured to operate in memory mirroring mode. If the DIMM for which the power fault was detected is configured to operate in memory mirroring mode with a DIMM that did not encounter a power fault event, the controller 202 may deactivate the DIMM that encountered the power fault event and continue information handling system 200 operation using the DIMM mirroring the failed DIMM's contents. For example, the controller 202 may de-assert the DIMM that encountered the power fault event and may continue operation of the information handling system instead of triggering a shutdown and/or reboot. The controller 202 may log the detected power fault and deactivation of the faulted DIMM in the power fault/failsafe arm/masking table 214. In some embodiments, the controller 202 may notify the BMC 206 of the detected power fault event.

As the DIMM's 204A-H of information handling system are organized in power groups, a single power good (PG) signal may be monitored for each power group. For example, a single PG signal for each power group may be monitored by the controller 202. The DIMMs may be designed according to and configured to operate according to a first generation DDR5 platform. If a power fault is detected via a first power good signal, for example a PG signal for the first power group, the controller 202 may assume that both DIMMs 204A-B have encountered a power fault, even if only a single DIMM 204A has encountered a power fault. For example, if a PMIC of DIMM 204A detects a power fault in DIMM 204A, it may de-assert the power group, forcing DIMM 204B to also shut down. For example DIMMs 204A-B grouped in the first power group may share a single PG bus to the controller 202 and thus a single PG signal for the power group may indicate a PG status of the power group. If the DIMMs 204A-B are configured to mirror each other according to a memory mirroring mode, the controller 202 may allow a system reboot to be triggered, as at least one of DIMMs 204A-B for which the power fault event was detected is not mirrored by a DIMM for which a power fault was not detected. However, if each of DIMMs 204A-B is mirrored by another DIMM that has not encountered a power fault event, such as DIMMs 204E-F, the controller 202 may deactivate DIMMs 204A-B without powering down the information handling system 200 and may continue operation of the information handling system 200 using the mirrored contents of DIMMs 204A-B in DIMMs 204E-F. Thus, even if DIMM 204B did not encounter a power fault, because DIMMs 204A-B are in the same PG, both of DIMMs 204A-B may be deactivated because the controller 202 may detect that a single PG signal for the power group indicates that one or more of the DIMMs 204A-B in the first power group have encountered a power fault event.

Figure 3:
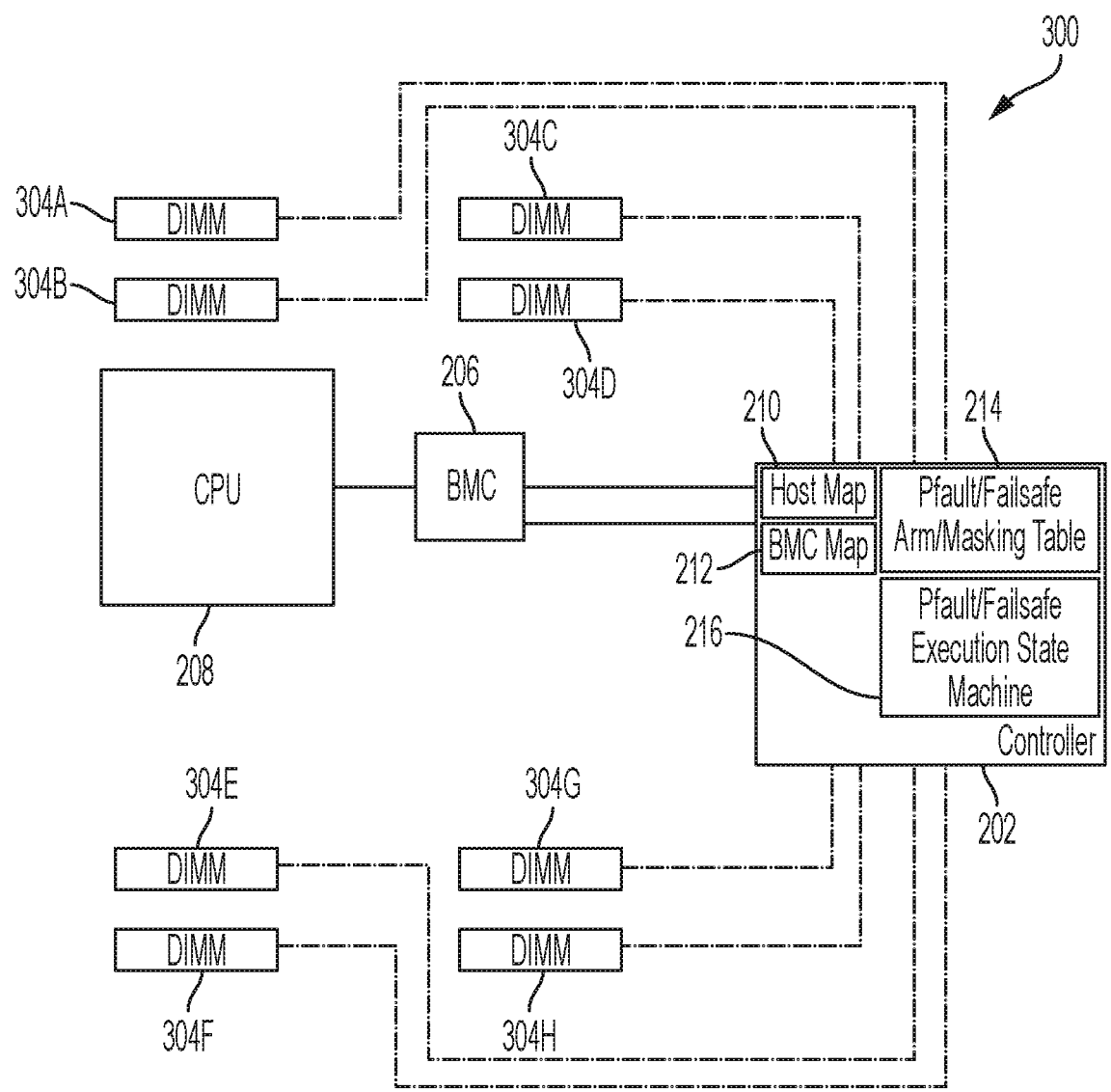
FIG. 3 is a block diagram of an example controller monitoring a plurality of DIMMs according to some embodiments of the disclosure.

In some configurations, PMICs of DIMMs of an information handling system may each which may generate a PG signal for the individual DIMM, such as in information handling system 300 of FIG. 3. For example, PMICs of DIMMs 304A-H may each be connected to the controller 202 via individual PG signal busses and may not be grouped together in power groups. For example, the connections between each of the DIMMs 304A-H may include PG signal connections, such as PG signal busses, for monitoring a PG signal for each of DIMMs 304A-H on a PG pin of each DIMMs 304A-H. The controller 202 may monitor PG signals for each of DIMMs 304A-H. In some embodiments, each of DIMMs 304A-H may be assigned or may include a DIMM-specific PMIC to control power delivery to the DIMM via a voltage rail of the DIMM. For example, the DIMMs 304A-H may be designed according to and configured to operate according to a second generation DDR5 platform. In some embodiments, each of DIMMs 304A-H may include an integrated PMIC. Because each of DIMMs 304A-H is associated with a DIMM-specific PMIC and PG signal, the controller 202 may detect power fault events of individual DIMMs and need not deactivate DIMMs that have not encountered a power fault event merely because they are grouped in a power group with a DIMM that did encounter a power fault event.

Upon booting of an information handling system, the controller 202 may wait for detection of rising edges of PG signals for each power group, or each DIMM depending on the configuration, before arming fault detection procedures for the DIMMs 304A-H or the DIMM power groups of FIG. 2. For example, the controller 202 may monitor for a rising edge of a power good PG signal for each DIMM or power group before arming a runtime power fault detection mechanism, such as initiating the power fault/failsafe execution state machine 216. Waiting until a rising edge of a PG signal for each DIMM or power group of the information handling system 200 is detected by the controller 202 may avoid unnecessary shutdowns during booting sequences due to transients detected in PG signals. Furthermore, when an information handling system is booting, a BIOS executed by the CPU 208 may notify the controller 202 of DIMMs that are deactivated, such as due to prior detected power fault events, and the controller 202 may refrain from arming a power fault detection mechanisms for the deactivated DIMMs.

Figure 4:
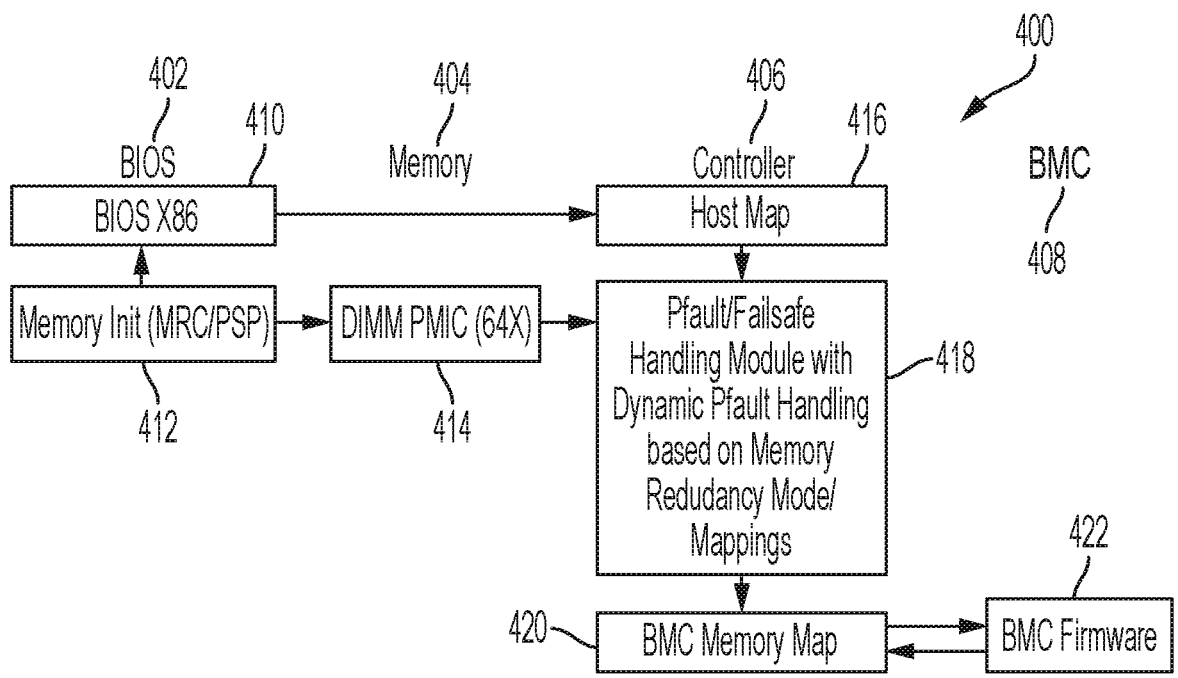
FIG. 4 is a block diagram of BIOS, memory, CPLD, and BMC software processes of an information handling system, according to some embodiments of the disclosure.

A BIOS 402, memory 404, controller 406, and baseboard management controller 408 of an information handling system 400 may communicate with each other to manage memory power fault detection and remediation, as shown in FIG. 4. The BIOS 402 may, for example, be executed by a processor of the information handling system. The memory 404 may, for example, include one or more DIMMs of the information handling system 200 having one or more PMICs. The controller 406 may be a CPLD. The BIOS 402, memory 404, controller 406, and BMC 408 may communicate with each other during a boot sequence of the information handling system 400, such as during a POST phase of the boot sequence of the information handling system 400, to initialize one or more DIMMs of the information handling system 400. The BIOS 402 may include a memory initialization module 412, such as an MRC and/or PSP module. The memory initialization module 412 may initialize memory 404 of the information handling system. For example, the memory initialization module 412 may communicate with DIMM PMIC 414 via an I2C and/or I3C interface to inventory the DIMMs of the information handling system, enable voltage regulation of DIMMs, and/or monitor health of the DIMMs. In some embodiments, the information handling system 400 may include up to and exceeding 64 DIMMs and PMICs for each of the DIMMs. The memory initialization module 412 may also communicate with an x86 module 410 of the BIOS 402. For example, the memory initialization module 412 may transmit an active slot map to the x86 module 410. The active slot map may describe which DIMMs or groups of DIMMs of the information handling system 400 are active and which DIMMs or groups of DIMMs are deactivated. Thus, the controller 406 may refrain from arming a runtime power fault detection mechanism for the DIMMs that are deactivated, based on the information received from the BIOS 402.

The x86 module 410 of the BIOS 410 may communicate with a controller 406 of the information handling system 400 during a boot phase. For example, the x86 module 410 of the BIOS 402 may transmit a message specifying which DIMMs or groups of DIMMs are active and which are deactivated to the controller 406. The x86 module 410 of the BIOS 402 may also transmit a message to the controller 406 including a redundancy map, specifying which memories are configured in a memory mirroring mode. For example, the redundancy map may specify which DIMMs that are configured to mirror each other. The controller 406 may store the information received from the BIOS 402 in a host map 416 of the controller 406. The controller 406 may execute a power fault/failsafe handling module 418. The power fault/failsafe handling module 418 may monitor the DIMMs of the information handling system 400, such as the DIMM PMICs 414, for power fault events. For example, the power fault/failsafe handling module 418 may monitor PG signals from each of the PMICs 414 to detect power faults that may, for example, be caused by voltage regulator failure. A power fault may be detected when a PG signal from a PMIC exceeds or falls below a predetermined range. When a power fault event is detected by the power fault/failsafe handling module 418, the module 418 may compare an identifier for the DIMM or group of DIMMs that encountered the power fault with the information specifying memory mirroring configuration in the host map 416.

If the DIMM that encountered the power fault event is in a memory mirroring mode with a DIMM that did not encounter a power fault event, the power fault/failsafe handling module 418 may deactivate the DIMM that encountered the power fault event without triggering a power down of the information handling system 400. The controller 406 may deactivate and/or de-assert the DIMM that encountered the power fault event, allowing the information handling system to continue operation in spite of the power fault detected in the DIMM. The controller 406 may replace the DIMM for which the power fault event is detected with a different DIMM configured in a memory mirroring mode with the DIMM that encountered the power fault event. In some embodiments, the controller 406 may adjust a BMC memory map 420, which may be communicated with a firmware 422 of the BMC via an interrupt request communication channel and/or a read/write communication channel. The power fault/failsafe handling module 418 of the controller 406 may communicate with a BMC memory map module 420 of the controller 406.

Figure 5:
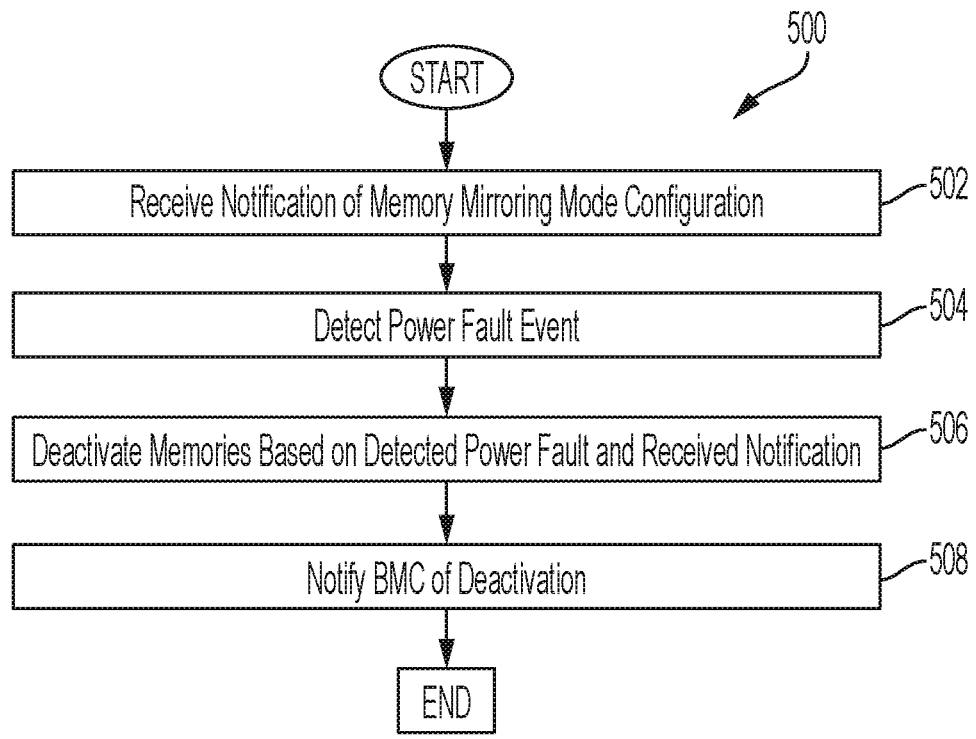
FIG. 5 is a block diagram of an example method for deactivating a memory in response to detection of a power fault event according to some embodiments of the disclosure.

A controller of an information handling system may be configured to deactivate a memory of the information handling system, such as a DIMM of the information handling system, when the memory of the information handling system encounters a power fault event instead of powering down and/or rebooting the information handling system. A method for handling memory power fault events 500 is shown in FIG. 5. The method 500 may begin, at step 502, with receiving a notification of a memory mirroring mode configuration. For example, a controller, such as a CPLD, for one or more memories of the information handling system may receive, from a BIOS, a notification that one or more memories of the information handling system are configured in a memory mirroring mode. For example, the controller 202, shown in FIGS. 2-3, may receive such a notification from a BIOS executed by the CPU 208. The notification may, for example, include a redundancy map specifying which memories are paired to each other in a redundant memory mirroring configuration. For example, the BIOS may notify the controller which DIMM slots or groups of DIMM slots are paired in redundant memory mirroring mode groupings. The notification may include physical slot locations for the memories that are configured in the memory mirroring mode. The notification may be transmitted from the BIOS to the controller via a system management interrupt (SMI).

At step 504, a power fault event may be detected. For example, the controller may detect a power fault event in one or more memories of the information handling system, such as in one or more DIMMs of the information handling system. The power fault event may be a runtime power fault event. For example, the controller may detect the power fault event by monitoring one or more PG signals for one or more memories and detecting that one or more PG signals for one or more memories has exceeded or fallen below a set PG threshold. In some embodiments, the controller may monitor a PG signal for multiple PMICs of DIMMs associated in a power group, while in other embodiments the controller may monitor PG signals for PMICs of each of the DIMMs. As one example, the controller 202 may monitor PG signals for memories 304A-D or for power groups including multiple memories generated by PMICs of memories of the power groups or individual memories and may detect a PG signal for at least one of memories 304A-D that exceeds or falls below a predetermined threshold.

At step 506, memories for which the power fault event was detected may be deactivated based on the detected power fault event and the received notification of the memory mirroring mode configuration. For example, the controller may deactivate one or more memories determined to have encountered the power fault event by mapping the one or more memories out from usage without rebooting the information handling system. As one example, if the controller 202 detects a power fault event associated with a PMIC controlling a memory in the power group including DIMMs 204A-B, the controller 202 may deactivate memories 204A-B. Before deactivating the one or more memories associated with the power fault, the controller may determine, based on the received notification of the memory mirroring mode configuration, whether the one or more memories that encountered the power fault are configured in a memory mirroring mode. In particular, the controller may determine whether the one or more memories that encountered the power fault event are mirrored by one or more memories that did not encounter the power fault event, or a different power fault event. If the memories that experienced the power fault event are not mirrored by memories that have not encountered a power fault event, the controller may shut down and/or reboot the information handling system. If the memories that experienced the power fault event are mirrored by memories that have not experienced a power fault event, the controller may deactivate the memories, avoiding a power down of the information handling system. In some embodiments, the controller may deactivate memories that did not encounter a power fault event. For example, if the memories are grouped in DIMM power groups, with a single PG signal reflecting power health of multiple DIMMs, as shown in FIG. 2, a controller may deactivate all memories of a memory power group if one of the memories in the memory power group encounters a power fault event causing a PG signal for the group to indicate that one or more of the memories in the power group has encountered a power fault event. Deactivating the one or more memories may include de-asserting the specific DIMM or group of DIMMs for which the power fault was detected and deactivating the DIMM/DIMMs.

At step 508, a BMC controlling the one or more memories that have been deactivated may be notified of the deactivation. For example, a controller, such as a CPLD, may notify the BMC of the deactivating after deactivating the one or more memories.

Figure 6:
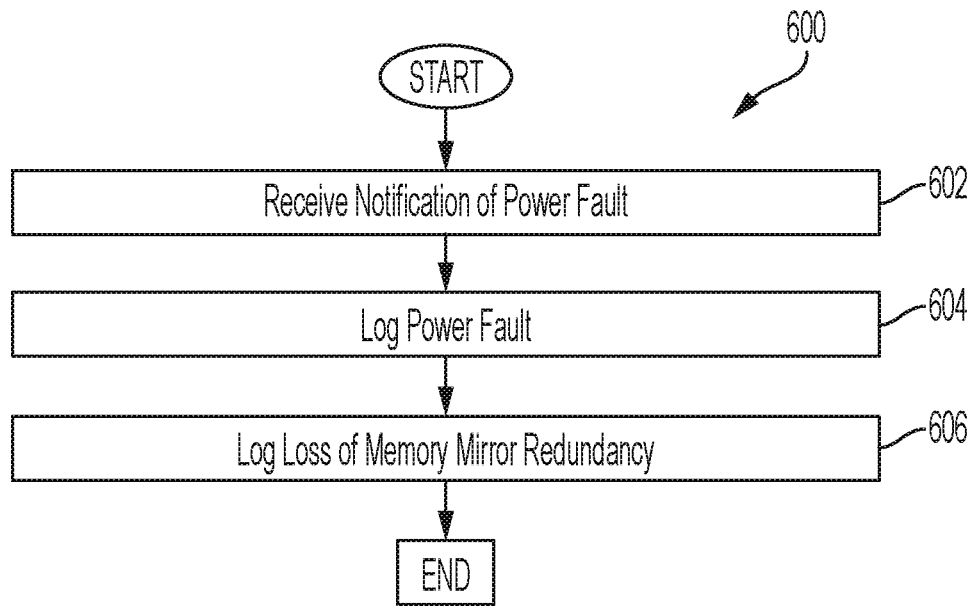
FIG. 6 is a block diagram of an example method for logging power fault event information according to some embodiments of the disclosure.

A BMC of an information handling system may record power fault details for use by a BIOS of the information handling system when the information handling system reboots. An example method 600 for recording power fault details is shown in FIG. 6. The method 600 may begin at step 602 with receipt of a notification of a power fault. For example, with reference to FIG. 3, BMC 206 may receive a notification from the controller 202 informing the BMC 206 that one or more DIMMs has encountered a power fault event. The BMC may, in some embodiments, search a flagged DIMM slot power fault register, such as a fault register of a PMIC of the DIMM slot that encountered the power fault event, to identify which DIMM encountered the power fault event. In some embodiments, such as embodiments where multiple DIMMs are grouped in power groups having a single PG signal, the BMC may search a PG group PMIC fault register for the group of memories to determine which of the one or more memories experienced the power fault. In some embodiments, searching power fault registers for a specific identity of a memory that has encountered a power fault event may be triggered by an interrupt received by the BMC from the controller of the memories.

At step 604, the BMC may log the power fault information. For example, the BMC may log details regarding the power fault event such as a potential cause of the power fault event and identification information for the one or more memories, such as the specific one or more DIMM slots, that encountered the power fault event.

At step 606, the BMC may log a loss of memory mirroring redundancy. For example, the BMC may log, for the memory that was mirroring the memory that encountered the power fault event, a notification that the memory that is still operable has lost memory mirroring redundancy. In some embodiments, the logged loss of memory mirroring redundancy may include information specifying the specific DIMM that failed and the specific DIMM that was mirroring the failed DIMM. Thus, upon a reboot, a BIOS may access the logged information regarding the power fault and loss of memory mirroring redundancy and may adjust a memory mirroring configuration and memory activation status accordingly.

Figure 7:
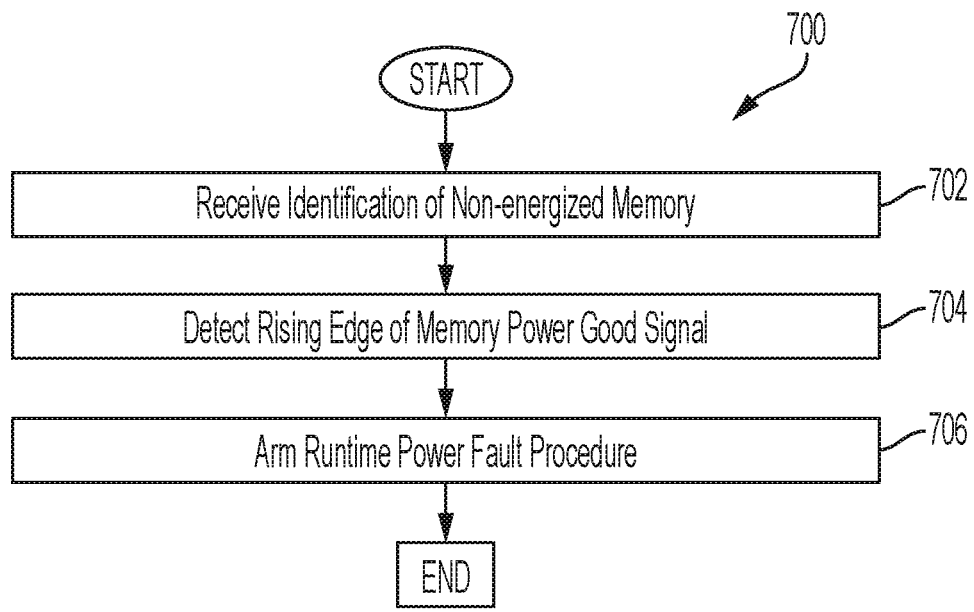
FIG. 7 is a block diagram of an example method for arming a runtime power fault detection procedure according to some embodiments of the disclosure.

When booting up, an information handling system may refrain from arming a runtime power fault detection procedure for memories that encountered runtime power faults prior to the information handling system cycling power. For example, as discussed above, when a memory that is configured in a memory mirroring mode encounters a power fault event and is deactivated, preventing activation of a runtime power fault detection procedure when the information handling system reboots may prevent the information handling system from detecting runtime power faults in memories that have already been deactivated. A method 700 for arming a runtime power fault procedure is shown in FIG. 7. The method 700 may begin, at step 702, with receipt of identification of one or more non-energized memories. For example, information handling system memory initialization code of a BIOS, such as MRC for Intel processors or PSP for AMD processors, may determine, during booting of an information handling system, such as during a POST phase of booting, whether any startup or prior runtime faults are detected in one or more memories of the information handling system. For example, the BIOS executed by the CPU 208 of FIG. 3 may read the information regarding a prior runtime power fault event detected by controller 202 and/or may read information regarding prior runtime fault events from blackboxes of one or more DIMM PMICs. The BIOS may determine to boot with one or more DIMMs offline that have encountered a power fault event, such as a startup or runtime power fault event. For example, the BIOS may deactivate one or more memories that encountered runtime power fault events such that the memories are offline and non-energized early during a POST phase of booting of an information handling system. The BIOS may notify a user that the information handling system will boot with one or more DIMMs offline. In some embodiments, the one or more non-energized memories that had encountered a power fault event may maintain a high PG signal to prevent a CPLD from incorrectly detecting a power fault event and forcing the information handling system to shut down based on the non-energized memories. During a warm reboot, PMICs and memories may maintain a status, such as energized or non-energized, that they possessed prior to initialization of the warm reboot. The BIOS may provide the controller, such as controller 202 of FIG. 3, with a notification that one or more memories of the information handling system are non-energized. In some embodiments, the BIOS may provide the notification that one or more memories are non-energized to the controller following completion of execution of MRC or PSP.

PMICs of DIMMs may be configured with a maximum time for monitoring voltage rails for the one or more DIMMs during booting of an information handling system. For example, PMICs may be programmed to monitor voltage rails for DIMMs to determine if the voltage rails are powered within 15 milliseconds of initiating a monitoring procedure. A BIOS may use the time value programmed in the DIMMs to detect DIMM power faults. For example, if a PG signal for one or more DIMMs generated by one or more PMICs does not rise within the predetermined time, MRC code of a BIOS may disable the one or more DIMMs and resume booting. The BIOS may disable the DIMMs during a POST phase of booting. Thus, a BIOS may use stored failure information from runtime faults, such as runtime fault information stored in a PMIC blackbox, as well power faults of memories detected during booting, to energize during a predetermined time to determine whether to deactivate one or DIMMs during booting.

At step 704, the controller may detect a rising edge of a memory PG signal. The controller, such as controller 202 of FIG. 3, may be configured to refrain from activation of a runtime fault detection procedure for one or more memories until a rising edge of a PG signal for one or more of the memories is detected. In some embodiments, the controller may be configured to refrain from activation of a runtime fault detection procedure until it detects a rising edge of a PG signal for each of the energized memories. For example, upon receipt of a notification of memories that are energized and memories that are non-energized from the BIOS, the controller may determine whether it has detected a rising edge for PG signals for each of the energized memories.

At step 706, once the controller has detected a rising edge of one or more PG signals and received an identification of one or more non-energized memories from the BIOS, the controller may arm a runtime power fault detection procedure for one or more memories of the information handling system. For example, upon initialization of a boot phase, the controller may begin to monitor PG signals for each memory or each PG group of memories of the information handling system. The controller may detect a rising edge of PG signals for each memory of the information handling system, even for non-energized memories. The controller may also receive an identification of one or more non-energized memories of the information handling system from the BIOS. Once rising edges are detected for each of the monitored PG signals and identification of one or more non-energized memories is received by the controller from the BIOS, the controller may arm a runtime power fault detection procedure for the energized memories. By refraining from arming a runtime power fault detection procedure prior to detection of a rising edge for each monitored PG signal, the controller may refrain from false power fault detection during a boot procedure. Furthermore, by arming a runtime fault detection procedure only for energized memories, the controller may refrain from false detection of runtime faults for memories that have been de-energized and are not being utilized by the information handling system. For example, unexpected transients or noise in PG signals from non-energized memories will not be recognized as power fault events by the information handling systems because the controller will not arm a runtime fault detection procedure for memories that are non-energized.

Figure 8:
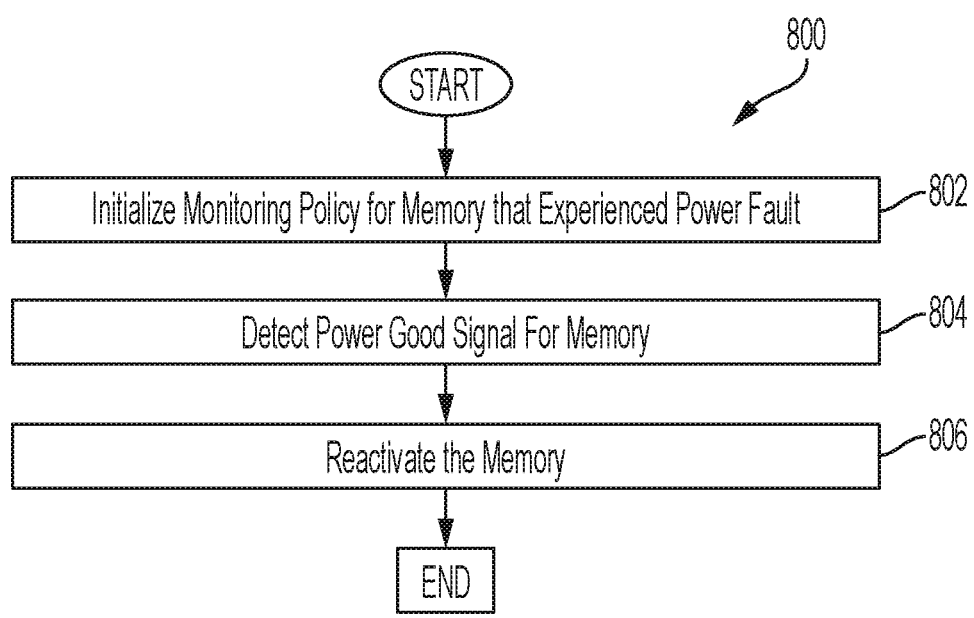
FIG. 8 is a block diagram of an example method for provisional activation of memories that have encountered power fault events according to some embodiments of the disclosure.

Memories may occasionally encounter runtime power fault events due to single-occurrence events, rather than long term operating issues. Instead of de-activating memories that encounter such single occurrence events until a technician is able to examine the memory that encountered the runtime fault event, an information handling system may provisionally re-activate such memories to enhance system resiliency. An example method 800 for provisional re-activation of a memory of an information handling system is shown in FIG. 8. The method 800 may begin, at step 802, with initialization of a monitoring policy for a memory that experienced a power fault. For example, when a memory, such as a DIMM, of an information handling system experiences a power fault, a controller, such as controller 202 of FIG. 3, may initialize a monitoring policy for the memory. Initializing the monitoring policy for the memory may include deactivating the memory based, at least in part, on detection of the power fault event. In some embodiments, the controller, such as a CPLD, may monitor a PG signal for a PMIC of the memory for a predetermined period of time, to determine whether the power fault event was a temporary condition or a long term problem with the memory. The controller may initialize the monitoring policy for the information handling system upon booting of the information handling system, or immediately after a power fault event is detected. For example, when a memory that was configured in a memory mirroring mode encounters a power fault event, the controller may deactivate the memory, mapping the memory out from usage, while invoking a monitoring policy for the memory. While the monitoring policy is implemented, the memory that encountered the power fault event may be mapped out of the system memory space but may remain energized for monitoring. In some embodiments, a BMC may alternatively or additionally monitor the PG status of the memory that encountered the power fault event while the monitoring policy is implemented.

At step 804, the controller, such as a CPLD or BMC, may detect a PG signal for the memory. For example, the controller may monitor a PG signal for the memory for a predetermined time, to determine whether the PG signal for the memory will meet a predetermined threshold for the predetermined period of time. If the PG signal meets the predetermined threshold for the predetermined period of time, the controller may determine that the detected power fault event was spurious.

At step 806, the memory may be reactivated. For example, the controller may instruct a BIOS of the information handling system, upon the next reboot of the information handling system, to map the memory back into the system memory space. For example, the controller may instruct an MRC or PSP of the BIOS to provisionally re-instate the memory, energizing the memory upon the next reboot and mapping the memory into the available system memory space. In some embodiments, the BIOS may also configure the memory that has been provisionally re-instated to operate in a memory mirroring mode. For example, the BIOS may enable address range mirroring of the full address range for the memory that encountered the power fault event. Then, after the memory has operated without experiencing a power fault event for a predetermined period of time, such as several weeks or months, the BIOS may disable the memory mirroring mode, to free up the memory space for other uses. Thus, if the power fault event was not spurious and the memory encounters another power fault event the system will not be forced to shut down, but instead may continue operation using the memory that mirrored the failed memory's contents. In some embodiments, the memories may be reactivated following a reboot of the information handling system, during a booting process. In some embodiments, the memories may be reactivated via a hot-add method and mapped into a system memory address space without rebooting the information handling system. In some embodiments, the method 800 may be performed with respect to a group of memories, such as a power group of DIMMs sharing a single PG signal.

The flow chart diagrams of FIGS. 5-8 are generally set forth as logical flow chart diagrams. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:
   detecting, by a controller of an information handling system, a power fault event for one or more of a plurality of memories controlled by the controller and configured in a memory mirroring mode with at least some information identical to information stored on another one or more of the plurality of memories; and
   deactivating, by the controller, the one or more of the plurality of memories by mapping the one or more of the plurality of memories out from usage without rebooting the information handling system based, at least in part, on the detection of the power fault event and a received notification indicating that one or more of the plurality of memories of the information handling system are configured in the memory mirroring mode.

2. The method of claim 1, wherein detecting, by the controller, a power fault event comprises detecting that a power good (PG) signal for the one or more of the plurality of memories has fallen below a predetermined threshold.

3. The method of claim 1, wherein each of the plurality of memories comprises one or more dual in-line memory modules (DIMMs).

4. The method of claim 1, further comprising: receiving, by the controller of the information handling system during a power-on self-test (POST) boot phase of the information handling system, a notification that each of the plurality of memories is configured in the memory mirroring mode.

5. The method of claim 1, further comprising:
detecting, by the controller, a rising edge of a power good (PG) signal for at least one of the plurality of memories, during a power-on self-test (POST) boot phase during a reboot of the information handling system; and
initializing, by the controller and based, at least in part, on the detection of the rising edge of the PG signal, monitoring for runtime power fault events for the at least one of the plurality of memories.

6. The method of claim 5, further comprising:
receiving, by the controller from a basic input output system (BIOS) of the information handling system, a message identifying at least one non-energized memory of the plurality of memories, during the POST boot phase,
wherein initializing, by the controller, monitoring for runtime power fault events for the at least one of the plurality of memories comprises initializing monitoring for runtime power fault events for each of the plurality of memories other than the at least one non-energized memory identified by the received message.

7. The method of claim 1, further comprising:
detecting a power good (PG) signal for the one or more of the plurality of memories for which the power fault event was detected that meets a predetermined threshold for a predetermined period of time; and
reactivating the one or more of the plurality of memories for which the power fault event was detected based, at least in part, on the detected power good (PG) signal.

8. The method of claim 7, wherein reactivating the one or more of the plurality of memories comprises instructing, by the controller, a basic input output system (BIOS) of the information handling system to map the one or more of the plurality of memories into an available memory space of the information handling system at a next reboot of the information handling system.

9. An information handling system, comprising: one or more central processing units (CPUs) including one or more processors; a controller; and a plurality of memories controlled by the controller and configured to operate in a memory mirroring mode, wherein the controller is configured to perform steps comprising: detecting a power fault event for one or more of the plurality of memories controlled by the controller and configured in a memory mirroring mode with at least some information identical to information stored on another one or more of the plurality of memories; and deactivating the one or more of the plurality of memories by mapping the one or more of the plurality of memories out from usage by the information handling system without rebooting the information handling system based, at least in part, on the detection of the power fault event and a received notification indicating that one or more of the plurality of memories of the information handling system are configured in the memory mirroring mode.

10. The information handling system of claim 9, wherein detecting a power fault event comprises detecting that a power good (PG) signal for the one or more of the plurality of memories has fallen below a predetermined threshold.

11. The information handling system of claim 9, wherein each of the plurality of memories comprises one or more dual in-line memory modules (DIMMs).

12. The information handling system of claim 9, wherein the controller is further configured to perform steps comprising receiving a notification that each of the plurality of memories controlled by the controller is configured in a memory mirroring mode during a power-on self-test (POST) boot phase of the information handling system.

13. The information handling system of claim 9, wherein the controller is configured to perform steps further comprising:
detecting a rising edge of a power good (PG) signal for at least one of the plurality of memories, during a power-on self-test (POST) boot phase during a reboot of the information handling system; and
initializing, by the controller and based, at least in part, on the detection of the rising edge of the PG signal, monitoring for runtime power fault events for the at least one of the plurality of memories.

14. The information handling system of claim 13, wherein the controller is further configured to perform steps comprising:
receiving, from a basic input output system (BIOS) of the information handling system, a message identifying at least one non-energized memory of the plurality of memories, during the POST boot phase,
wherein initializing monitoring, by the controller, for runtime power fault events for the at least one of the plurality of memories comprises initializing monitoring for runtime power fault events for each of the plurality of memories other than the at least one non-energized memory identified by the received message.

15. The information handling system of claim 9, wherein the controller is further configured to perform steps comprising:
detecting a power good (PG) signal for the one or more of the plurality of memories for which the power fault event was detected that meets a predetermined threshold for a predetermined period of time; and
reactivating the one or more of the plurality of memories for which the power fault event was detected based, at least in part, on the detected power good (PG) signal.

16. The information handling system of claim 15, wherein reactivating the one or more of the plurality of memories comprises instructing a basic input output system (BIOS) of the information handling system to map the one or more of the plurality of memories into an available memory space of the information handling system at a next reboot of the information handling system.

17. A method, comprising:
detecting a power fault event for a memory of an information handling system;
detecting a power good (PG) signal for the memory that meets a predetermined threshold for a predetermined period of time; and
reactivating the memory based, at least in part, on the detected power good (PG) signal meeting the predetermined threshold for the predetermined period of time.

18. The method of claim 17, further comprising deactivating the memory by mapping the memory out from usage by the information handling system without rebooting the information handling system while maintaining an energized state of the memory based, at least in part, on the detection of the power fault event.

19. The method of claim 17, wherein reactivating the memory is performed after rebooting the information handling system and comprises enabling address range mirroring for the memory of the information handling system.

20. The method of claim 19, wherein reactivating the memory further comprises:
 determining that the memory has not encountered a power fault event for a predetermined time following enablement of address range mirroring for the memory; and
 disabling address range mirroring for the memory of the information handling system.

* * * * *